(12) United States Patent
Alvarado et al.

(10) Patent No.: US 8,446,019 B2
(45) Date of Patent: *May 21, 2013

(54) SOLDER BUMP INTERCONNECT

(75) Inventors: Reynante Alvarado, Chandler, AZ (US); Yuan Lu, Phoenix, AZ (US); Richard Redburn, Phoenix, AZ (US)

(73) Assignee: Flipchip International, LLC, Phoenix, AZ (US)

( * ) Notice: Subject to any disclaimer, the term of this patent is extended or adjusted under 35 U.S.C. 154(b) by 74 days.

This patent is subject to a terminal disclaimer.

(21) Appl. No.: 13/457,311

(22) Filed: Apr. 26, 2012

(65) Prior Publication Data

US 2012/0228765 A1    Sep. 13, 2012

Related U.S. Application Data

(63) Continuation of application No. 13/085,759, filed on Apr. 13, 2011, now Pat. No. 8,188,606, which is a continuation of application No. 12/107,009, filed on Apr. 21, 2008, now Pat. No. 7,973,418.

(60) Provisional application No. 60/913,337, filed on Apr. 23, 2007.

(51) Int. Cl.
*H01L 23/48* (2006.01)
*H01L 23/52* (2006.01)
*H01L 29/40* (2006.01)

(52) U.S. Cl.
USPC .................................. 257/780; 257/E23.021

(58) Field of Classification Search
USPC .......................................... 257/780, E23.021
See application file for complete search history.

(56) References Cited

U.S. PATENT DOCUMENTS

| 4,878,098 A | 10/1989 | Saito et al. |
| 5,327,013 A | 7/1994 | Moore et al. |
| 5,844,304 A | 12/1998 | Kata et al. |
| 6,287,893 B1 | 9/2001 | Elenius et al. |
| 6,400,021 B1 | 6/2002 | Cho |

(Continued)

FOREIGN PATENT DOCUMENTS

| JP | 52-87983 | 7/1977 |
| JP | 2000-164637 | 6/2000 |

(Continued)

OTHER PUBLICATIONS

Fried, L. J., et al., A VLSI Bipolar Metallization Design with Three-Level Wiring and Area Array Solder Connections, *IBM J. Res. Develop.* 26(1):362-371, May 1982.

(Continued)

*Primary Examiner* — Jenny L Wagner
(74) *Attorney, Agent, or Firm* — Greenberg Traurig, LLP

(57) ABSTRACT

A semiconductor package includes a device pad on a substrate. A first polymer layer overlies the substrate, and the first polymer layer has an opening to expose the device pad. In one embodiment, a redistribution layer (RDL) comprises a landing pad, and the RDL is positioned on the first polymer layer and conductively coupled to the device pad. A second polymer layer is on the RDL, and an under bump metal pad (UBM) is on the landing pad and extends onto a top surface of the second polymer layer. In one embodiment, a shortest distance from a center of the landing pad to an outer edge of the landing pad, and a shortest distance from a center of the UBM to an outer edge of the UBM are in a ratio that ranges from 0.5:1 up to 0.95:1.

16 Claims, 9 Drawing Sheets

U.S. PATENT DOCUMENTS

| | | |
|---|---|---|
| 6,441,487 B2 | 8/2002 | Elenius et al. |
| 6,528,881 B1 | 3/2003 | Tsuboi |
| 6,586,323 B1 | 7/2003 | Fan et al. |
| 6,593,220 B1 | 7/2003 | Yu et al. |
| 6,617,655 B1 | 9/2003 | Estacio et al. |
| 6,621,164 B2 | 9/2003 | Hwang et al. |
| 6,908,717 B2 | 6/2005 | Hirano et al. |
| 7,244,671 B2 | 7/2007 | Mis et al. |
| 7,973,418 B2 | 7/2011 | Alvarado et al. |
| 8,188,606 B2 | 5/2012 | Alvarado et al. |
| 2004/0099959 A1 | 5/2004 | Tang |
| 2004/0191955 A1 | 9/2004 | Joshi et al. |
| 2006/0060970 A1 | 3/2006 | Jeong et al. |
| 2006/0170100 A1 | 8/2006 | Richling et al. |

FOREIGN PATENT DOCUMENTS

| | | |
|---|---|---|
| JP | 2003-209137 | 7/2003 |
| JP | 2005-235905 | 9/2005 |
| WO | WO2006/050127 | 5/2006 |

OTHER PUBLICATIONS

International Search Report for related International App. No. PCT/US2005/039008, dated Sep. 24, 2007.

International Search Report for related International App. No. PCT/US2008/061186, dated Oct. 15, 2008.

International Preliminary Report on Patentability and Written Opinion, dated Oct. 27, 2009, for related International Patent Application No. PCT/US2008/061186.

Supplementary European Search Report for related European Patent Application No. 05824732.1 dated Jan. 16, 2009.

Chinese Office Action dated Aug. 28, 2009 for related Chinese patent application No. 200580045561.2 with English translation.

Chinese Office Action dated Sep. 15, 2010 for related Chinese Patent Application No. 200880002933.7 with English translation.

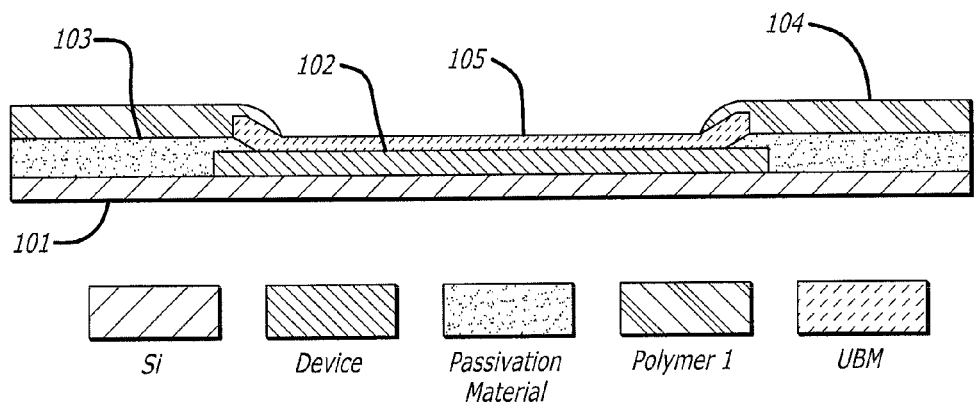
FIG. 1 *(Prior Art)*
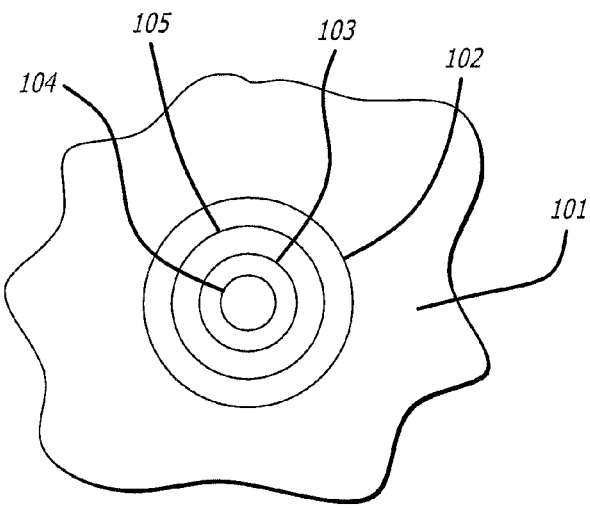
FIG. 2 *(Prior Art)*

SOLDER BUMP INTERCONNECT

RELATED APPLICATIONS

This application is a continuation of U.S. Non-Provisional application Ser. No. 13/085,759, filed Apr. 13, 2011 now U.S. Pat. No. 8,188,606, which itself is a continuation of U.S. Non-Provisional application Ser. No. 12/107,009, filed Apr. 21, 2008 now U.S. Pat. No. 7,973,418, which itself claims the benefit of and priority to U.S. Provisional Application Ser. No. 60/913,337, filed Apr. 23, 2007, all of which applications are incorporated herein by reference in their entirety.

This application is related to PCT Patent Application Serial No. PCT/US05/39008, filed Oct. 28, 2005, and is also related to U.S. Provisional Patent Application Ser. No. 60/623,200, filed Oct. 28, 2004, both of which applications are incorporated herein by reference in their entirety.

This application includes material which is subject to copyright protection. The copyright owner has no objection to the facsimile reproduction by anyone of the patent disclosure, as it appears in the Patent and Trademark Office files or records, but otherwise reserves all copyright rights whatsoever.

FIELD

The instant disclosure relates to the field of electronic wafer level chip scale packaging and flip chip packaging and assembly, and more specifically provides a solder bump interconnect structure.

BACKGROUND

Traditionally, wire bonding was used to provide an electrical connection between semiconductor devices and external circuitry. The semiconductor device is diced from the wafer on which it was fabricated and placed face-up in a package. Small wires, typically made of gold or copper, are then welded between bond pads present on the semiconductor device and external leads on the package.

Flip chip technology derives its name from placing the semiconductor device face down in the package. Electrical connections between the semiconductor device and the external leads of the package are made by reflowing conductive solder bumps on the surface of the semiconductor device.

Flip chip technology allows a larger number of electrical connections to be made because the entire area of the semiconductor device can be used for forming bond pads whereas in wire bonding the bond pads are typically formed around the periphery of the semiconductor device. Flip chip technology also facilitates faster electrical connections between the semiconductor device and external circuitry by eliminating the resistance and capacitance associated with wire bonds.

Wafer-level chip-scale package ("WLCSP") or wafer level package ("WLP") advances the concept of flip chip by forming the electrical connections directly on the semiconductor device, during fabrication of the semiconductor device. This allows the semiconductor device to be directly mounted to a printed circuit board ("PCB"), thereby eliminating the need for a separate package. The resulting packaged device is similarly sized to the bare semiconductor device. WLCSP implementations benefit from further increases in electrical performance as well as smaller package size. The transition in the industry from solders with lead metallurgy to non-lead metallurgies for WLCSP have resulted in more sensitivity to effects of thermal cycling and sudden mechanical shock for high reliability chip packaging.

Redistribution layer ("RDL") technology allows older semiconductor device designs, in which the bond pads are located around the periphery of the device, to use WLCSP. RDLs create an electrical path between the bond pads on a semiconductor device and the solder bumps, allowing the solder bumps to be evenly distributed across the entire area of the semiconductor device.

FIG. 1 illustrates a prior art bump on IO structure on a device pad prior to solder bumping, and FIG. 2a illustrates the prior art bump on IO structure of FIG. 1 after solder bump 106 is applied. The device consists of substrate 101, device pad 102 and passivation layer 103. Device pad 102 is a metal material, typically comprising aluminum, copper, or a composite of both. Device pad 102 can be formed using any of several methods commonly known in the industry. Substrate 101 may comprise materials such as Silicon, Gallium Arsenide, Lithium Tantalate, Silicon Germanium or other. For clarity, substrate material will generally be referred to herein as Silicon, but the use thereof should not be interpreted as intending to limit the disclosure to only Silicon based substrates.

Device passivation layer 103 typically comprises a silicon nitride, oxidenitride or the like. Passivation layer 103 is not continuous over the device pad, but rather has defined openings where there is no passivation material, which are individually referred to as a passivation opening. The passivation opening is illustrated in more detail in FIG. 2, which provides a top view of the bump on IO structure of FIG. 1. The passivation opening is normally circular and centered on device pad 102. The passivation opening defines a region in which subsequent metal will be deposited in the WLCSP processing or flip chip packaging processing to make a connection and adhere to the device pad.

The prior art for placing an underlying bump on IO structure, such as that illustrated in FIGS. 1 and 2, consists of forming under bump metal pad ("UBM") 105 using standard metal deposition methods such as metal plating, metal sputtering, or the like. UBM 105 may comprise any of a number of well known materials, including Ti(W)/Cu; Al/Electroless Ni/Immersion Au; Al/Electroless Ni/Pd/Au; AlCu/Electroless Ni/Immersion Au; AlCuSi/Electroless Ni/Immersion Au; and AlSi/Electroless Ni/Immersion Au. Because of the techniques and materials used, UBM 105 can adhere to passivation material 103 and device pad 102, and typically forms a layer of about 1.0 microns or greater. The upper surface of UBM 105 provides a site for solder bump placement and facilitates adherence thereof. In FIGS. 1 and 2, the UBM solder bump site is defined by the opening in polymer 104.

Traditional prior art processes utilize a polymer material consisting of a polyimide, benzocyclobutene ("BCB") or the like. The thickness of polymer 104 is typically 10 microns or less. Polymer 104 is typically photodefined to create an opening which is normally circular and centered on UBM 105. In this example and in majority of traditional prior art solder bumping structures, the diameter of device pad 102 is greater than or equal to the diameter of UBM 105, resulting in a ratio of 1:1 or greater. In such traditional prior art solder bumping structures, the diameter of the opening in polymer 104 is typically less than the diameter of UBM 105, with a ratio of 0.86:1 or less.

FIGS. 3 and 4 illustrate a cross-sectional view and top view, respectively, of alternative prior art bump on IO structures. In this version of the prior art, the diameter of device pad 302 is less than the diameter of UBM 305, with a typical ratio of 0.43:1. The polymer opening diameter is less than the diameter of UBM 305, with a typical ratio of 0.32:1. The prior art for placing an underlying structure such as that illustrated in FIGS. 3 and 4 consists of placing polymer 304, such as polyimide, benzocyclobutene, polybenzoxazole (PBO), derivatives of polybenzoxazole, or the like over an opening in device passivation layer 303 and over device pad 302. The thickness of polymer 304 is typically 10 microns or less. Polymer 304 is then photodefined to create an opening which is normally circular and centered on the device passivation opening, and open to the surface of device pad 302.

At this point in the process, polymer 304 has defined a region that connects to device passivation layer 303, and which falls inside the opening in device passivation layer 303. The open region in polymer 304 is known as the polymer opening. Once the polymer opening is defined, UBM 305 will be deposited via standard methods, such as metal plating, metal sputtering or the like. This process forms UBM 305 such that the bottom of UBM 305 adheres to polymer 304, any exposed passivation portion of device passivation layer 303 between polymer 304 and device pad 302, and device pad 302 itself. The top side of UBM 305 is a defined surface for solder bump placement and adherence.

In this structure and in majority of underlying solder bumping structures, the diameter of device pad 302 is less than the diameter of UBM 305, and typically has a ratio of 0.43:1. This results in a significant overlap of UBM 305 over device pad 302. In addition, the diameter of the opening in polymer 304 is typically less than the diameter of UBM 305, and typically has a ratio of 0.32:1.

FIGS. 5 and 6 are cross-sectional views illustrating an exemplary prior art redistribution layer ("RDL") underlying structure prior to solder bumping. FIG. 6a is a cross-sectional view illustrating an exemplary prior art RDL underlying structure after solder bump 508 has been applied. FIG. 7 is a top view of the structure illustrated in FIGS. 5 and 6. RDL trace 505 is formed using standard metal deposition methods which are well known in the industry. The RDL trace can be either a single layer of metal or stacked metal layers such as titanium/aluminum/titanium or copper or aluminum or nickel copper or chromium/copper/chromium or other. At the end of RDL trace 505, the metal is typically formed into a circular pattern to become landing pad 505a. Landing pad 505a provides a connection point for subsequent WLCSP or flip chip packaging processing. The landing pad can be a single layer of metal or a stack of metal layers such as aluminum, aluminum/nickel/copper, titanium/aluminum/titanium or copper or nickel/gold/copper or other. Once trace 505 and landing pad 505a have been formed, a photodefineable polymer 2 material 506 is deposited over trace 505 and landing pad 505a. An opening is then defined in the polymer 2 material 506, with the opening located in the center area of landing pad 505a and exposing a portion of landing pad 505a. All polymer 2 material 506 outside of the center of the landing pad remains intact, covering trace 505. The thickness of polymer 2 material 506 is typically 20 microns or less. UBM 507 is formed over polymer 2 material 506 and onto landing pad 505a to create an electrical connection between UBM 507 and landing pad 505a.

Typically, landing pad 505a has a diameter greater than or equal to the diameter of UBM 507. Traditional landing pad diameter to UBM diameter ratios are 1:1 or greater. The polymer 2 opening diameter to UBM diameter ratio is typically 0.9:1 or greater. FIG. 6a illustrates a typical solder bump on RDL.

The prevailing trend in the semiconductor industry is to shift to processing technologies that employ smaller feature sizes, allowing semiconductor devices to exhibit more functionality. System-on-a-chip ("SoC") devices are an example of the class of semiconductor devices made possible by smaller feature sizes, and are exemplified by the structures illustrated in FIGS. 3 and 4. Smaller feature sizes, combined with larger functionality, has led to reduced input-output ("IO") pad sizes, as illustrated by comparing FIGS. 1 and 2 with FIGS. 3 and 4. The final IO pad geometry in WLCSP applications has become significantly smaller than the required solder bump, thereby creating a narrow neck structure between the solder bump and the final IO pad geometry. The narrow neck introduces instability and inconsistency to the solder bumps, further increasing their sensitivity to temperature cycling and sudden mechanical impact shock.

SUMMARY

Accordingly, it would be desirable to have an improved semiconductor package that provides improved mechanical and thermo-mechanical performance in reliability testing such as mechanical drop testing, mechanical shock or vibration testing, mechanical shear testing, temperature cycling, temperature shock testing or other test used in testing semiconductor packages, especially when rigid solder compositions other than leaded solder compositions are utilized for the solder bumps. The instant disclosure is directed to solder bump interconnect structures that substantially obviate one or more of the problems due to limitations and disadvantages of the related art.

Additional features and advantages of the invention will be set forth in the description which follows, and in part will be apparent from this disclosure, or may be learned by practice of the invention. The objectives and other advantages of the invention will be realized and attained by the structure particularly pointed out in this written description, including any claims contained herein and the appended drawings.

In some embodiments, a redistributed chip scale package having a substrate and a final metal pad with a final metal pad size is provided. A device passivation layer, deposited over the final metal pad, has a passivation opening, wherein the passivation layer is locally removed to expose the underlying final metal pad. A polymer layer, deposited over the passivation layer, has a polymer opening, wherein the polymer layer is locally removed to expose the underlying final metal pad. A conductive layer, deposited over the polymer layer, wherein the conductive layer is patterned to provide a trace and a landing pad, the landing pad having a landing pad length. A polymer layer, deposited over the conductive layer has a polymer layer opening, wherein the polymer layer is locally removed to expose the underlying landing pad. An under bump metal layer, deposited over the polymer layer, has a final under bump metal size and an under bump metal overhang. The ratio of the polymer opening diameter to the final under bump metal diameter ranges from approximately 0.35:1 to approximately 0.85:1. The ratio of the landing pad diameter to the final under bump metal diameter ranges from approximately 0.5:1 to approximately 0.95:1. In embodiments in which the under bump metal and other regions have an approximately circular geometry, the above-defined lengths correspond to the diameter thereof.

In some embodiments, a solder bump-on-IO chip scale package having a substrate and a final metal pad with a final metal pad size is provided. A device passivation layer, deposited over the final metal pad, has a passivation opening, wherein the passivation layer is locally removed to expose the underlying final metal pad. A polymer layer, deposited over the passivation layer, has a polymer opening, wherein the polymer layer is locally removed to expose the underlying final metal pad. An under bump metal layer, deposited over the polymer layer, has a final under bump metal size. The ratio of the polymer opening to the final under bump metal size ranges from approximately 0.35:1 to approximately 0.85:1. The ratio of the final metal pad size to the final under bump metal size ranges from approximately 0.5:1 to approximately 0.95:1. The ratio of the passivation opening to the final under bump metal size ranges from approximately 0.35:1 to approximately 0.80:1. In embodiments in which the under bump metal and other regions have an approximately circular geometry, the above-defined lengths correspond to the diameter thereof.

It is to be understood that both the foregoing general description and the following detailed description are exemplary and explanatory and are intended to provide further explanation of the disclosed solder bump interconnect structures.

BRIEF DESCRIPTION OF THE DRAWINGS

The accompanying drawings, which are included to provide a further understanding of the disclosed solder bump interconnect structures with improved thermo-mechanical strength and drop test performance and are incorporated in and constitute a part of this specification, illustrate exemplary embodiments and, together with the description, serve to explain the principles of at least one embodiment of the disclosed solder bump interconnect structures with improved thermo-mechanical strength and drop test performance.

In the drawings:

FIG. 1 illustrates a prior art bump on IO structure on a device pad prior to solder bumping.

FIG. 2 illustrates a top view of the bump on IO structure of FIG. 1.

DETAILED DESCRIPTION

The following description and the drawings illustrate specific embodiments sufficiently to enable those skilled in the art to practice the systems and methods described herein. Other embodiments may incorporate structural, logical, process and other changes, and are intended to fall within the scope of this disclosure. Examples merely typify possible variations.

The elements that implement the various embodiments of the present system and method are described below. Many elements may be configured using well-known structures. It should also be understood that the techniques of the present system and method might be implemented using a variety of technologies.

The disclosure of specific embodiments of a solder bump interconnect structures with improved thermo-mechanical strength and drop test performance is now presented below. The semiconductor device package is typically implemented as a chip scale package or a wafer level package, for example, as used for chip-on-board assembly applications or as a standard flip-chip package used in flip-chip package applications. Examples of such implementations are described in U.S. Pat. No. 6,441,487 (titled Chip Scale Package Using Large Ductile Solder Balls by Elenius et al. issued Aug. 27, 2002), U.S. Pat. No. 5,844,304 (titled Process for Manufacturing Semiconductor Device and Semiconductor Wafer by Kata et al. issued Dec. 1, 1998), U.S. Pat. No. 5,547,740 (titled Solderable Contacts for Flip Chip Integrated Circuit Devices by Higdon, et al. issued Aug. 20, 1996), U.S. Pat. No. 6,251,501 (titled Surface Mount Circuit Device and Solder Bumping Method Therefor by Higdon et al. issued Jun. 26, 2001), and PCT Patent Application No. PCT/US05/39008 (titled Semiconductor Device Package with Bump Overlying a Polymer Layer by Vrtis et al. filed Oct. 28, 2005) which are each hereby incorporated by reference at least for their teachings regarding packaging applications, structures and fabrication methods.

An advantage of the disclosed interconnect structure is that it can take advantage of prior art manufacturing techniques to achieve the desired increases in thermo-mechanical strength and drop test performance. An optimum underlying structure is disclosed which defines the diameter of the UBM, the diameter of the polymer opening, the diameter of the device passivation opening, and the diameter of the device pad. Although described herein as employing circular geometries, alternative geometries may be substituted for the UBM, the polymer opening, the device passivation opening, and/or the device pad without departing from the spirit or the scope of the disclosure. By way of example, without limitation, in an embodiment one or more of the structures may be defined using a square geometry. In such an embodiment, the length of a side of the structure can be substituted for the corresponding diameter.

Figure 2A:
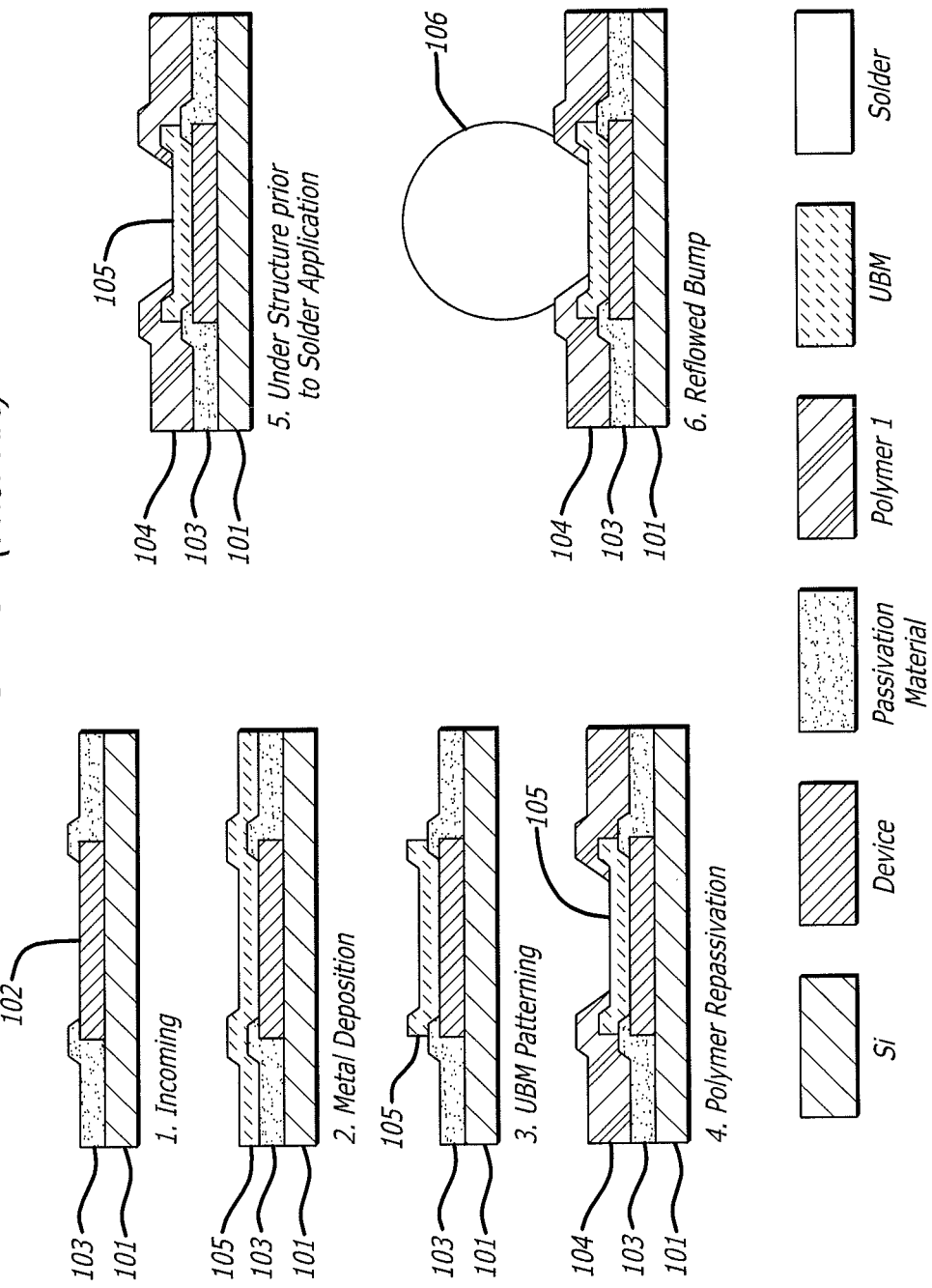
FIG. 2a illustrates a typical prior art process for creating a bump on IO structure on a device pad, including the creation of the solder bump.
Figure 3:
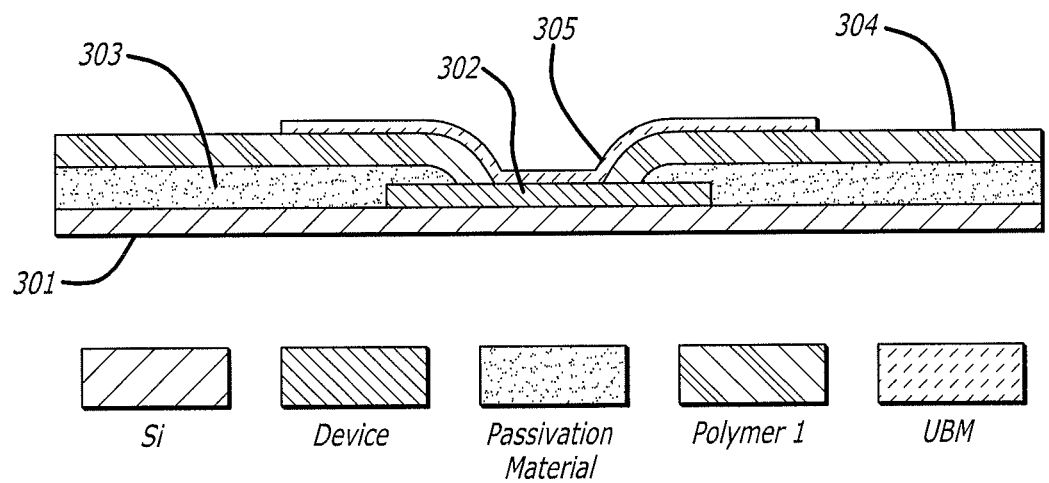
FIG. 3 illustrates an alternative prior art bump on IO structure on a device pad prior to solder bumping.
Figure 4:
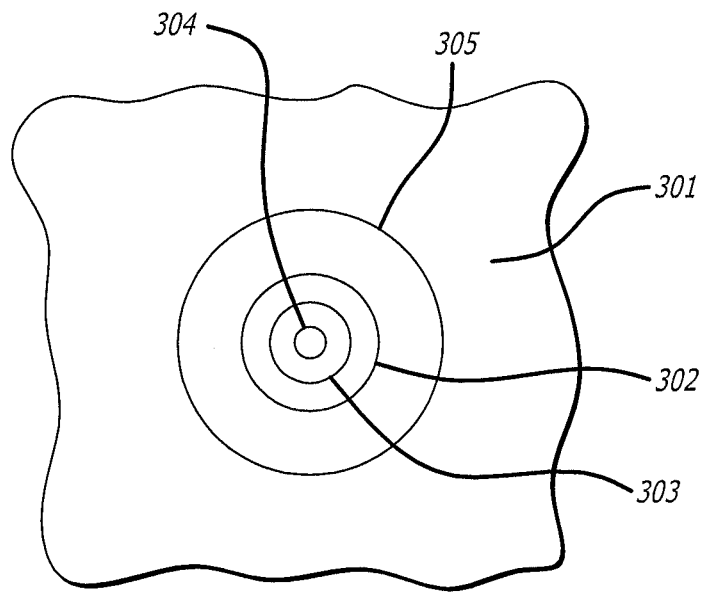
FIG. 4 illustrates a top view of the bump on IO structure of FIG. 3.
Figure 5:
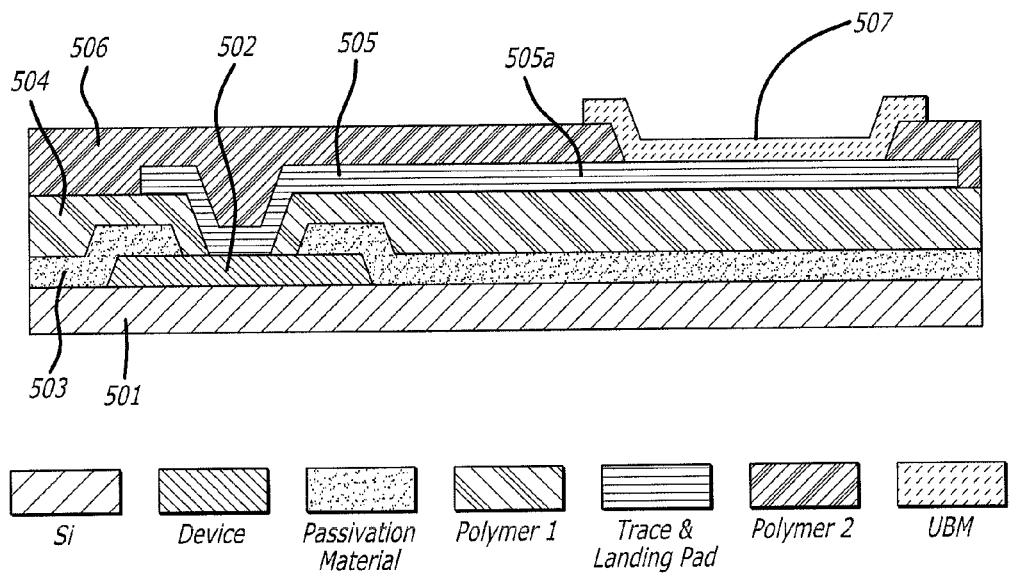
FIG. 5 is a cross-sectional view of an exemplary prior art redistribution layer structure.
Figure 6:
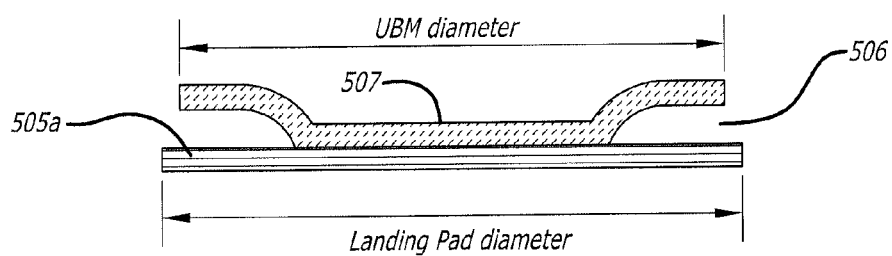
FIG. 6 is a detailed view of a portion of the redistribution layer structure illustrated in FIG. 5.
Figure 6A:
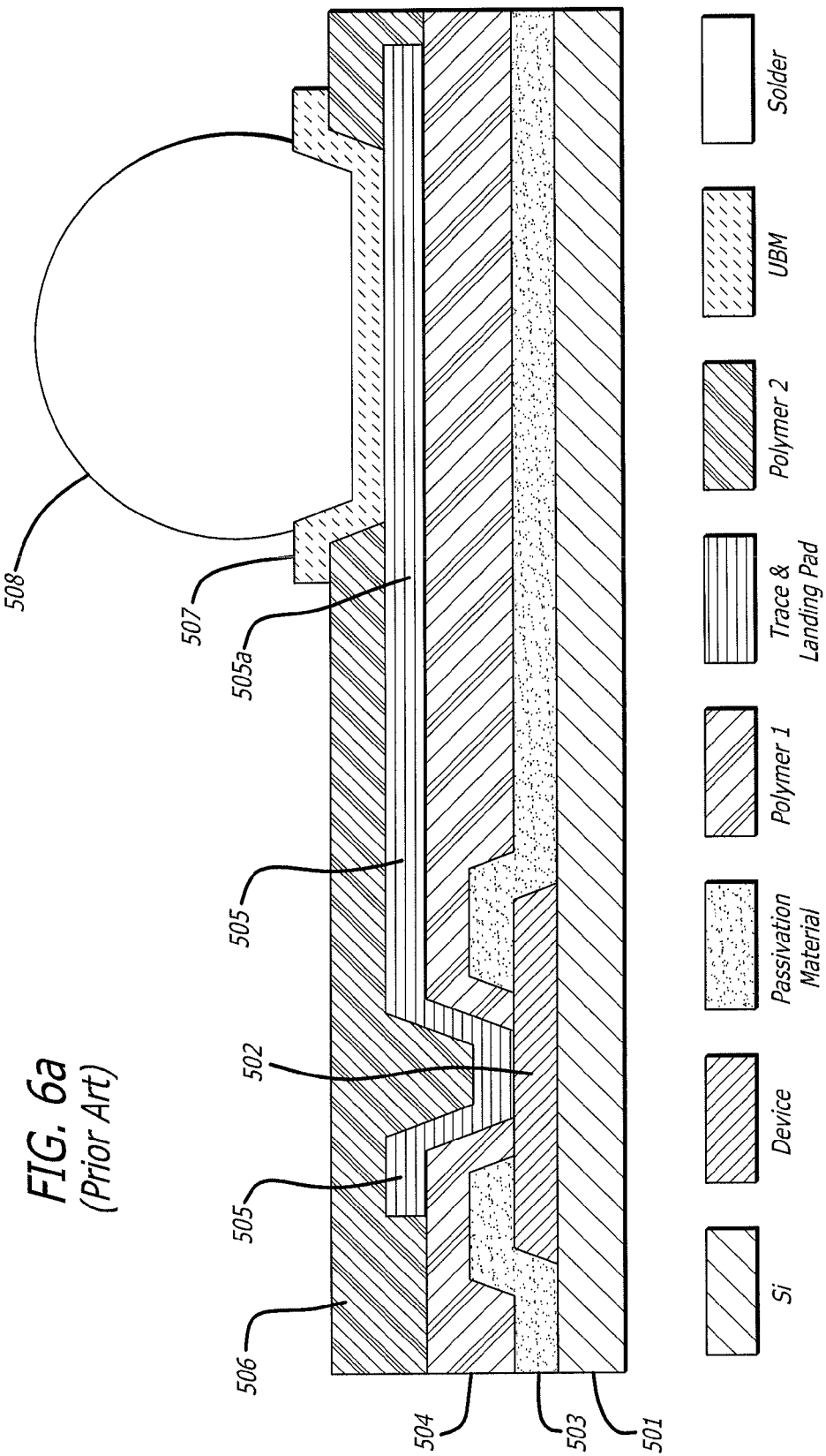
FIG. 6a is a cross-sectional view of an exemplary prior art bump on RDL structure, including the solder bump.
Figure 7:
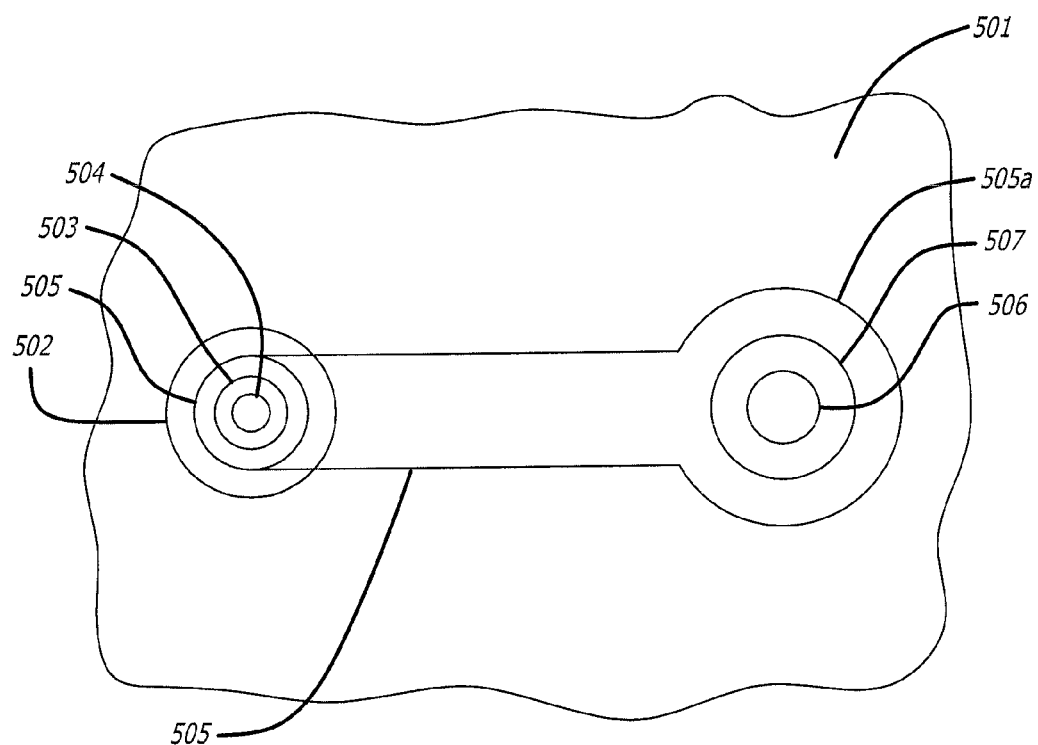
FIG. 7 is a top view of the redistribution layer structure illustrated in FIG. 5.
Figure 8:
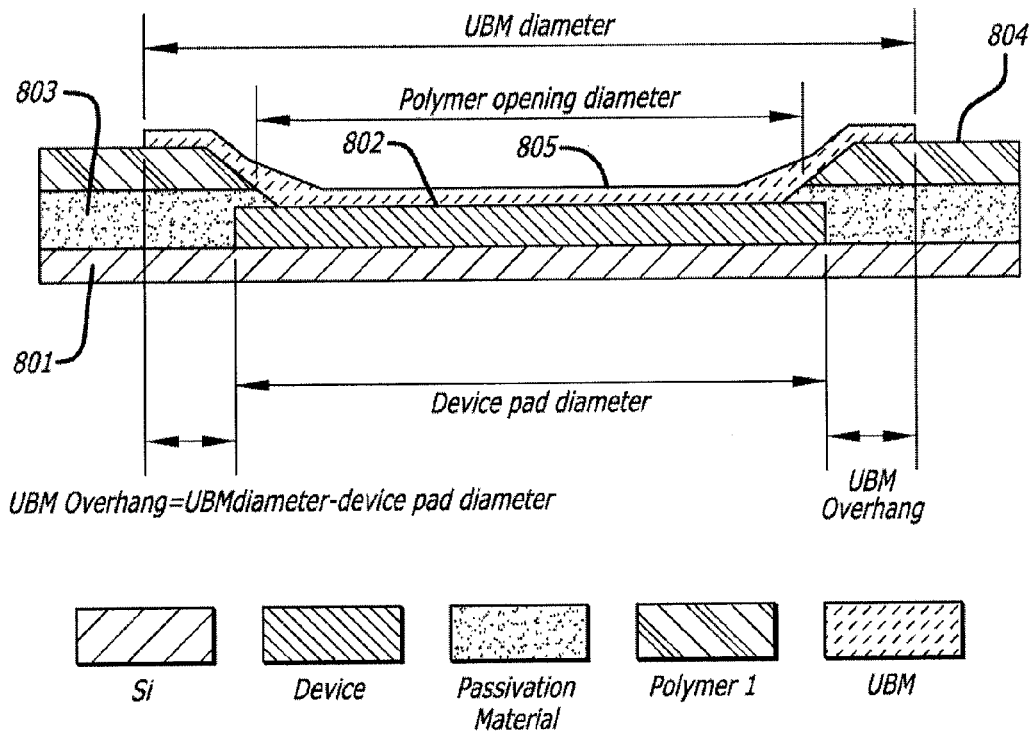
FIG. 8 is a cross-sectional view of an exemplary bump on IO structure according to an embodiment.
Figure 9:
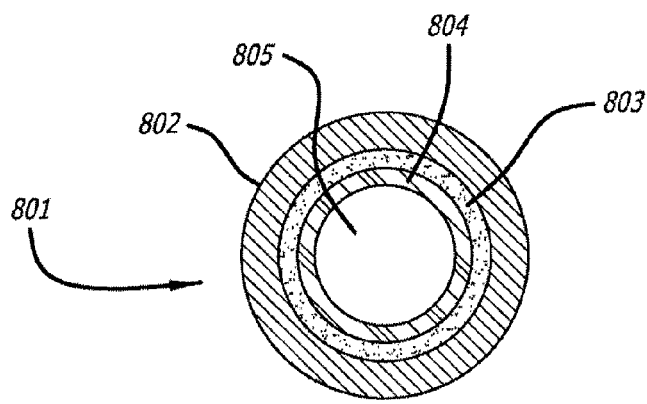
FIG. 9 is a top view of the exemplary bump on IO structure illustrated in FIG. 8.

FIGS. 8 and 9 illustrate an exemplary bump on IO structure employing the ratios described herein. In FIGS. 8 and 9, the ratio of the diameter of device pad 802 to the diameter of UBM 805 ranges from 0.5:1 up to 0.95:1. The ratio of the diameter of the opening in polymer 804 to the diameter of UBM 805 ranges from 0.35:1 up to 0.85:1. The ratio of the diameter of the opening in device passivation layer 803 to the diameter of UBM 805 ranges from 0.35:1 up to 0.80:1. By employing these size ratios, the instant bump on IO structure permits the forces associated with thermal and mechanical stress to be distributed more evenly throughout the bump on IO structure, thereby improving the overall performance of the structure under adverse conditions, as further described below.

Figure 10:
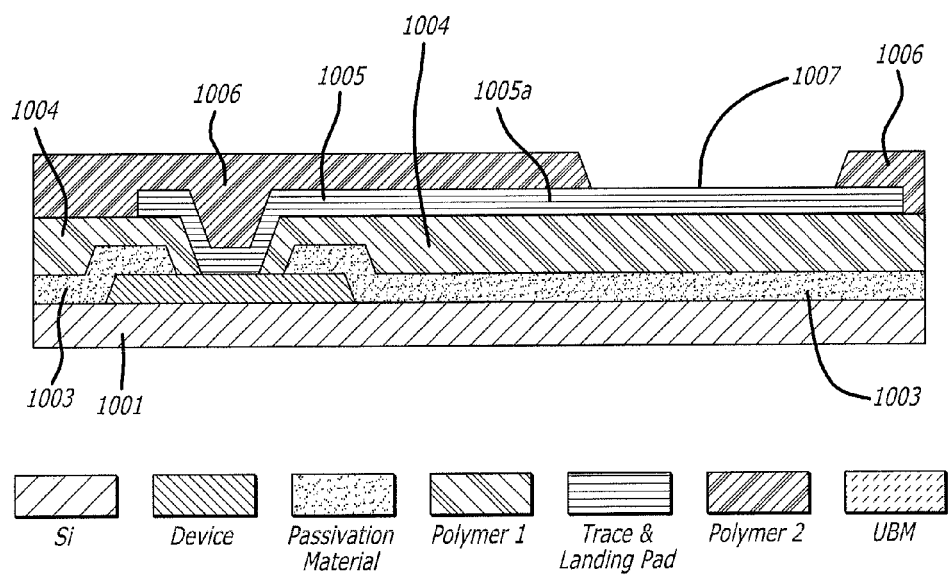
FIG. 10 is a cross-sectional view of an exemplary redistribution layer structure according to an embodiment.
Figure 11:
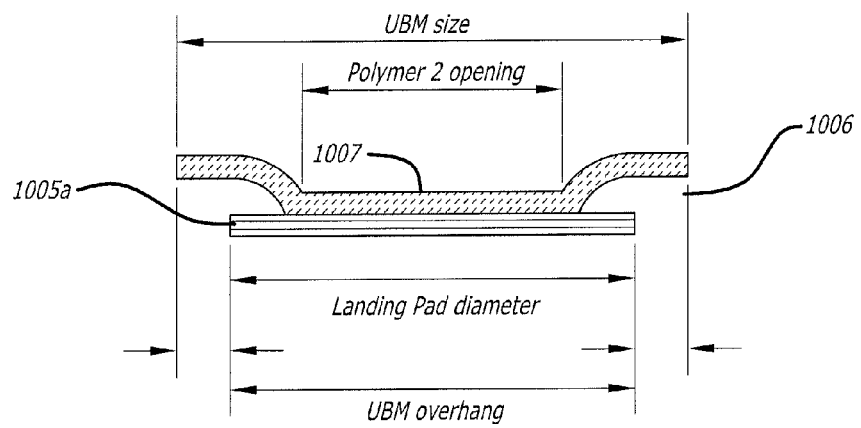
FIG. 11 is a detailed view of a portion of the redistribution layer illustrated in FIG. 10.
Figure 12:
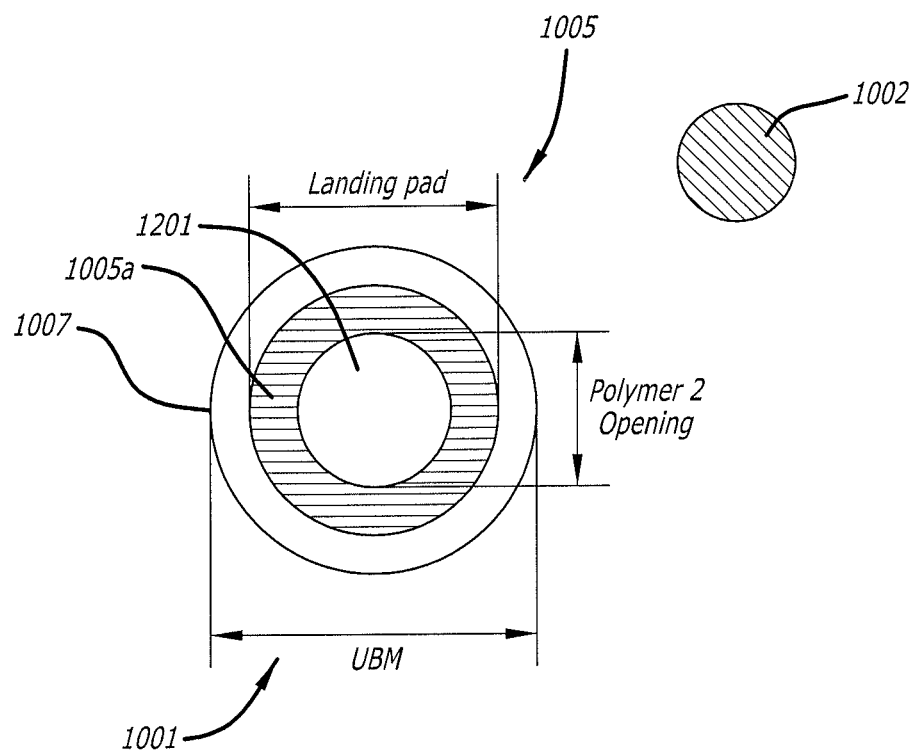
FIG. 12 is a top view of the exemplary redistribution layer structure illustrated in FIG. 10.

FIGS. 10, 11, and 12 illustrate an exemplary RDL underlying structure. In FIGS. 10 through 12, the ratio of the diameter of landing pad 1005a to the diameter of UBM 1007 ranges from 0.5:1 up to 0.95:1 The ratio of the diameter of the opening in polymer 2 layer 1006 to the diameter of UBM 1007 ranges from 0.35:1 up to 0.85:1. By employing these size ratios, the RDL underlying structure permits the forces associated with thermal and mechanical stress to be distributed more evenly throughout the RDL underlying structure, thereby improving the overall performance of the structure under adverse conditions, as further described below.

The Joint Electron Device Engineering Council (JEDEC) JESD22-B111 standard provides a method of evaluating a flip chip's or WLCSP's ability to withstand the mechanical shock that a semiconductor device would experience if it was in a portable device that was dropped. Prior WLCSPs exhibited failure before 100 drops. Various embodiments of the invention as described herein have enhanced the drop test performance of WLCSPs by approximately over 200%, wherein they are now able to withstand 100 or more drops.

Through the implementation of the component geometries described herein, the new bump structure offers increased thermo-mechanical stability and enhances the overall structure's ability to absorb the impact from sudden drops. By way of example, with respect to thermo-mechanical stability, temperature cycle test (TCT) at 5% failure rate of 95% confidence can be improved by more than 100% (in some cases exceeding 600 cycles). JEDEC drop test performance can be improved by more than 100%. In 2nd level tests for TCT using JESDA104B of the bump on IO implementation, the new structure generally exhibited a first failure at greater than 600 cycles. Similarly, the bump on IO drop test using the JESD22-B111 standard passed with no fails up to 800 drops. The redistributed bump structures have survived 2nd level test results for TCT using JESDA104B up to 1000 cycles, and the redistributed bump structures have survived JESD22-B111 standard drop tests of up to 800 drops.

Although specific exemplary apparatuses and methods were described above, one of skill in the art will recognize that in other embodiments many of the above steps may be re-arranged and/or omitted. The foregoing description of specific embodiments reveals the general nature of the disclosure sufficiently that others can, by applying current knowledge, readily modify and/or adapt it for various applications without departing from the generic concept. For example, additional polymer layers and redistribution traces could be used to form multiple layers of metal (e.g., up to five layers) above the semiconductor wafer. Therefore, such adaptations and modifications are within the meaning and range of equivalents of the disclosed embodiments. The phraseology or terminology employed herein is for the purpose of description and not of limitation.

The invention claimed is:

1. A structure, comprising:
a device pad on a substrate;
an under bump metal pad on the device pad;
a passivation layer on the substrate, the passivation layer having an opening to expose a portion of the device pad;
a polymer layer on the passivation layer, the polymer layer extending outward away from the device pad beyond an outer edge of the under bump metal pad, wherein the under bump metal pad extends onto a top surface of the polymer layer and electrically connects to the device pad through an opening in the polymer layer; and
a solder bump on the under bump metal pad;
wherein a shortest distance from a center of the device pad to an outer edge of the device pad, and a shortest distance from a center of the under bump metal pad to the outer edge of the under bump metal pad are in a ratio that ranges from 0.5:1 up to 0.95:1.

2. The structure of claim 1, wherein the polymer layer is separated from the device pad by the passivation layer, and a bottom surface of the under bump metal pad is in contact with a portion of the passivation layer overlying the device pad.

3. The structure of claim 1, wherein a shortest distance from a center of the opening in the polymer layer to an outer edge of the opening in the polymer layer, and a shortest distance from the center of the under bump metal pad to the outer edge of the under bump metal pad are in a ratio that ranges from 0.35:1 up to 0.85:1.

4. The structure of claim 1, wherein a shortest distance from a center of the opening in the passivation layer to an outer edge of the opening in the passivation layer, and a shortest distance from the center of the under bump metal pad to the outer edge of the under bump metal pad are in a ratio that ranges from 0.35:1 up to 0.80:1.

5. The structure of claim 1, wherein:
a shortest distance from a center of the opening in the polymer layer to an outer edge of the opening in the polymer layer, and a shortest distance from the center of the under hump metal pad to the outer edge of the under bump metal pad are in a ratio that ranges from 0.35:1 up to 0.85:1; and
a shortest distance from a center of the opening in the passivation layer to an outer edge of the opening in the passivation layer, and a shortest distance from the center of the under bump metal pad to the outer edge of the under bump metal pad are in a ratio that ranges from 0.35:1 up to 0.80:1.

6. A structure, comprising:
a device pad on a substrate;
a first polymer layer overlying the substrate, the first polymer layer having an opening to expose the device pad;
a redistribution layer comprising a landing pad, the redistribution layer positioned on the first polymer layer and conductively coupled to the device pad;
a second polymer layer on the redistribution layer;
an under bump metal pad on the landing pad, wherein the under bump metal pad electrically connects to the landing pad through an opening in the second polymer layer; and
a solder bump on the under bump metal pad;
wherein a shortest distance from a center of the landing pad to an outer edge of the landing pad, and a shortest distance from a center of the under bump metal pad to an outer edge of the under hump metal pad are in a ratio that ranges from 0.5:1 up to 0.95:1.

7. The structure of claim 6, wherein the under bump metal pad extends onto a top surface of the second polymer layer.

8. The structure of claim 6, wherein the solder bump has a generally spherical shape and has an outer surface extending beyond the outer edge of the under bump metal pad.

9. The structure of claim 6, wherein a shortest distance from a center of the opening in the second polymer layer to an outer edge of the opening in the second polymer layer, and a shortest distance from the center of the under bump metal pad to the outer edge of the under bump metal pad are in a ratio that ranges from 0.35:1 up to 0.85:1.

10. A structure, comprising:
a device pad on a substrate;
a first polymer layer overlying the substrate, the first polymer layer having an opening to expose the device pad;
a redistribution layer comprising a landing pad, the redistribution layer positioned on the first polymer layer;
a second polymer layer on the redistribution layer;
an under bump metal pad on the landing pad, wherein the under bump metal pad electrically connects to the landing pad through an opening in the second polymer layer; and
a solder bump on the under bump metal pad;

wherein a shortest distance from a center of the landing pad to an outer edge of the landing pad, and a shortest distance from a center of the under bump metal pad to an outer edge of the under bump metal pad are in a ratio that ranges from 0.5:1 up to 0.95:1.

11. The structure of claim 10, wherein the under bump metal pad extends onto a top surface of the second polymer layer.

12. The structure of claim 10, wherein the solder bump has an outer surface extending beyond the outer edge of the under bump metal pad.

13. The structure of claim 10, wherein a shortest distance from a center of the opening in the second polymer layer to an outer edge of the opening in the second polymer layer, and a shortest distance from the center of the under bump metal pad to the outer edge of the under bump metal pad are in a ratio that ranges from 0.35:1 up to 0.85:1.

14. The structure of claim 10, wherein the second polymer layer is polybenzoxazole.

15. A structure, comprising:
   a device pad on a substrate;
   a first polymer layer overlying the substrate, the first polymer layer having an opening to expose the device pad;
   a redistribution layer comprising a landing pad, the redistribution layer positioned on the first polymer layer and conductively coupled to the device pad;
   a second polymer layer on the redistribution layer;
   an under bump metal pad on the landing pad and extending onto a top surface of the second polymer layer, wherein the under bump metal pad electrically connects to the landing pad through an opening in the second polymer layer; and
   a solder bump on the under bump metal pad;
   wherein a shortest distance from a center of the opening in the second polymer layer to an outer edge of the opening in the second polymer layer, and a shortest distance from a center of the under bump metal pad to an outer edge of the under bump metal pad are in a ratio that ranges from 0.35:1 up to 0.85:1.

16. The structure of claim 15, wherein a shortest distance from a center of the landing pad to an outer edge of the landing pad, and a shortest distance from the center of the under bump metal pad to the outer edge of the under bump metal pad are in a ratio that ranges from 0.5:1 up to 0.95:1.

* * * * *

UNITED STATES PATENT AND TRADEMARK OFFICE
CERTIFICATE OF CORRECTION

PATENT NO.        : 8,446,019 B2                                          Page 1 of 1
APPLICATION NO.   : 13/457311
DATED             : May 21, 2013
INVENTOR(S)       : Alvarado et al.

It is certified that error appears in the above-identified patent and that said Letters Patent is hereby corrected as shown below:

IN THE SPECIFICATION

Column 6, Line 24, delete "PCT/U505/39008" and insert -- PCT/US05/39008 --, therefor.

IN THE CLAIMS

Column 8, Line 18, in Claim 5, delete "hump" and insert -- bump --, therefor.

Column 8, Line 43, in Claim 6, delete "hump" and insert -- bump --, therefor.

Signed and Sealed this
Fourth Day of March, 2014

Michelle K. Lee
*Deputy Director of the United States Patent and Trademark Office*